(12) United States Patent
Chen et al.

(10) Patent No.: US 12,417,794 B2
(45) Date of Patent: Sep. 16, 2025

(54) MEMORY DEVICE

(71) Applicant: NANYA TECHNOLOGY CORPORATION, New Taipei (TW)

(72) Inventors: Chien Yu Chen, New Taipei (TW); Po-Jen Yang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 190 days.

(21) Appl. No.: 18/515,257

(22) Filed: Nov. 21, 2023

(65) Prior Publication Data
US 2025/0166678 A1 May 22, 2025

(51) Int. Cl.
*G11C 7/22* (2006.01)
*G11C 7/10* (2006.01)
*G11C 7/14* (2006.01)

(52) U.S. Cl.
CPC ............ *G11C 7/222* (2013.01); *G11C 7/1066* (2013.01); *G11C 7/14* (2013.01)

(58) Field of Classification Search
CPC ..................................................... G11C 7/222
See application file for complete search history.

(56) References Cited

U.S. PATENT DOCUMENTS

| | | | |
|---|---|---|---|
| 2017/0110165 A1 | 4/2017 | Kim et al. | |
| 2018/0122486 A1 | 5/2018 | Choi et al. | |
| 2018/0204610 A1 | 7/2018 | Hsieh et al. | |
| 2020/0133505 A1* | 4/2020 | Kim | G11C 11/4096 |
| 2020/0302981 A1 | 9/2020 | Kim et al. | |
| 2021/0183431 A1* | 6/2021 | Kwak | G11C 11/4076 |

FOREIGN PATENT DOCUMENTS

CN 116312672 6/2023

OTHER PUBLICATIONS

"Office Action of Taiwan Counterpart Application", issued on May 9, 2025, p. 1-p. 4.

* cited by examiner

*Primary Examiner* — Hoai V Ho
(74) *Attorney, Agent, or Firm* — JCIPRNET

(57) ABSTRACT

A memory device is provided. The memory device includes a first training circuit and a second training circuit. The first training circuit is configured to generate a first clock signal having a first pulse width according a command address (CA) training signal. The second training circuit is coupled to the first training circuit and is configured to adjust the first pulse width of the first clock signal to output a second clock signal having a second pulse width when it is determined that the CA training signal is not enabled.

11 Claims, 6 Drawing Sheets

MEMORY DEVICE

BACKGROUND

1. Technical Field

The disclosure generally relates to a device, in particular, to a memory device.

2. Description of Related Art

In different memory transmission standards, such as DDR4, LPDDR4, DDR5 issued by JEDEC, a data rate of the command address (CA) signal continues to go up, so that a CA training function becomes available for a processor coupled to a memory device. The processor may gain a possible access for optimizing a setup time, a hold time, or a pulse width of the CA bus relative to the memory clock.

SUMMARY

Accordingly, the disclosure is directed to a memory device which may perform the CA training function when the CA training function is not activated or enabled by the processor coupled to the memory device.

The memory device of the disclosure includes a first training circuit and a second training circuit. The first training circuit is configured to generate a first clock signal having a first pulse width according a command address (CA) training signal. The second training circuit is coupled to the first training circuit and is configured to adjust the first pulse width of the first clock signal to output a second clock signal having a second pulse width when it is determined that the CA training signal is not enabled.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
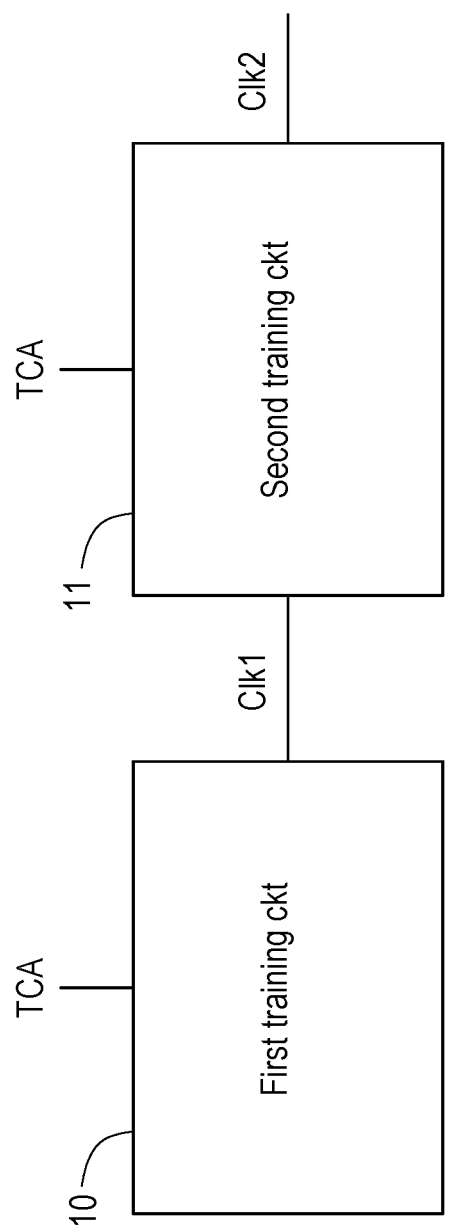
FIG. 1 illustrates a memory device 1 in accordance with some embodiments of the present disclosure.

FIG. 1 illustrates a memory device 1 in accordance with some embodiments of the present disclosure. Although not illustrated, the memory device 1 is disposed in a memory system accessible to a processor. The memory device 1 includes a first training circuit 10 and a second training circuit 11. The first training circuit 10 is configured to generate a first clock signal Clk1 having a first pulse width according to a CA training signal TCA. The second training circuit 11 is coupled to the first training circuit 10 and configured to adjust the first pulse width of the first clock signal Clk1 to output a second clock signal Clk2 having a second pulse width when it is determined that the CA training signal TCA is not enabled. In brief, the memory device 1 provides a CA training function to the processor, such that the processor may adjusts a pulse width of a clock signal used for CA accessing to optimize the transmission there between. However, not all processors are equipped or enabled of using such function, so that the second training circuit 11 is disposed in the memory device 1 for training the clock signal in case that the CA training function is not enabled or used by the processor.

The first training circuit 10 is configured to output the first clock signal Clk1 having the first pulse width according to the CA training signal TCA. The processor is capable of changing the pulse width of the first clock signal Clk1 used for CA access by providing the CA training signal TCA. The second training circuit 11 is coupled to the first training circuit 10. When the second training circuit 11 determines that the CA training signal TCA is enabled and the first clock signal Clk1 is adjusted based on the processor instructions, the second training circuit 11 may pass the first clock signal Clk1 as the second clock signal Clk2. When the second training circuit 11 determines that the CA training signal TCA is not enabled and the first clock signal Clk1 is not adjusted based on the processor instructions, the second training circuit 11 may be configured to adjust the first pulse width of the first clock signal Clk1 to output the second clock signal Clk2 having the second pulse width.

Figure 2A:
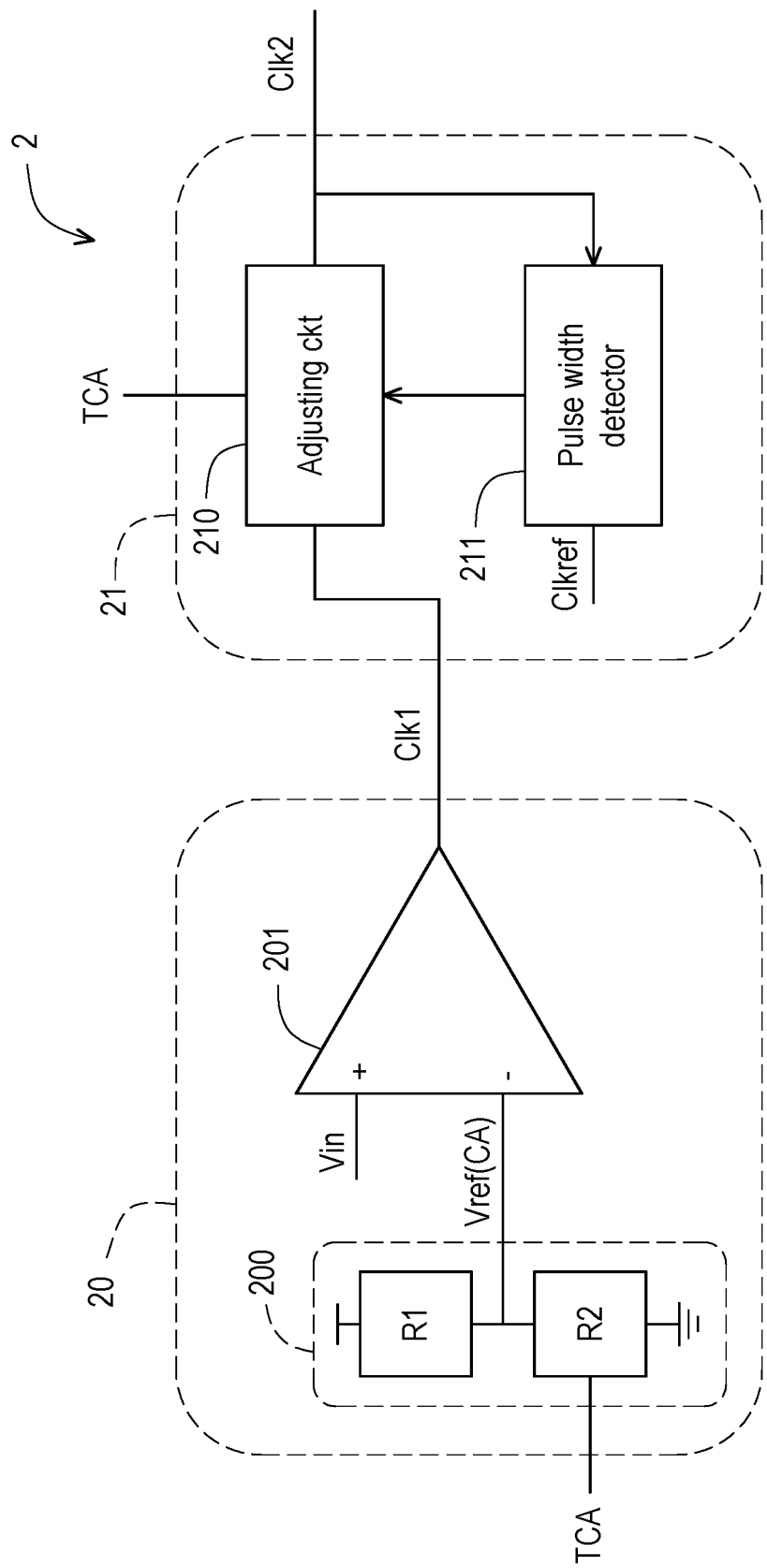
FIG. 2A illustrates a memory device 2 in accordance with some embodiments of the present disclosure.

FIG. 2A illustrates a memory device 2 in accordance with some embodiments of the present disclosure. The memory device 2 in FIG. 2A is similar to the memory device 1 in FIG. 1, with more detailed circuit is illustrated in FIG. 2A. The memory device 2 includes a first training circuit 20 and a second training circuit 21 respectively similar to the first training circuit 10 and the second training circuit 11 in FIG. 1.

Specifically, the first training circuit 20 includes a reference voltage training circuit 200 and a first comparator 201. The reference voltage training circuit 200 is configured to generate a reference voltage Vref(CA) according to the CA training signal TCA. The first comparator 201 is configured to receive an input signal Vin and the reference voltage Vref(CA) respectively at a first input end a second input end of the first comparator 201, and output a comparison result as the first clock signal Clk1 at an output end of the first comparator 201.

In some embodiments, the reference voltage training circuit 200 is configured to generate the reference voltage Vref(CA) according to the CA training signal TCA. When the CA training signal TCA is enabled and defined at a specific voltage level, the reference voltage training circuit 200 is configured to generate the reference voltage Vref(CA) at an appropriate voltage level corresponding to the CA training signal TCA. Specifically, the reference voltage training circuit 200 includes a first resistor R1 and a second resistor R1. The first resistor R1 and the second resistor R2 are coupled in series between a first supply voltage VDD and a second supply voltage VSS. The reference voltage Vref (CA) is generated at a node coupled between the first resistor R1 and the second resistor R2. Specifically, at least one of the first resistor R1 and the second resistor R2 is a variable resistor controlled by the CA training signal TCA, so that the reference voltage may be generated according to a biased result of the first resistor R1 and the second resistor R2 controlled by the CA training signal TCA. In this embodiment, the second resistor R2 is the variable resistor and controlled by the CA training signal TCA. However, when the CA training signal TCA is not enabled, the voltage level of the CA training signal TCA may be undefined or set at a default voltage level. As such, the reference voltage training circuit 200 may be controlled by the CA training signal TCA to generate the reference voltage Vref(CA) at a random voltage level or a predetermined voltage level.

Figure 2B:
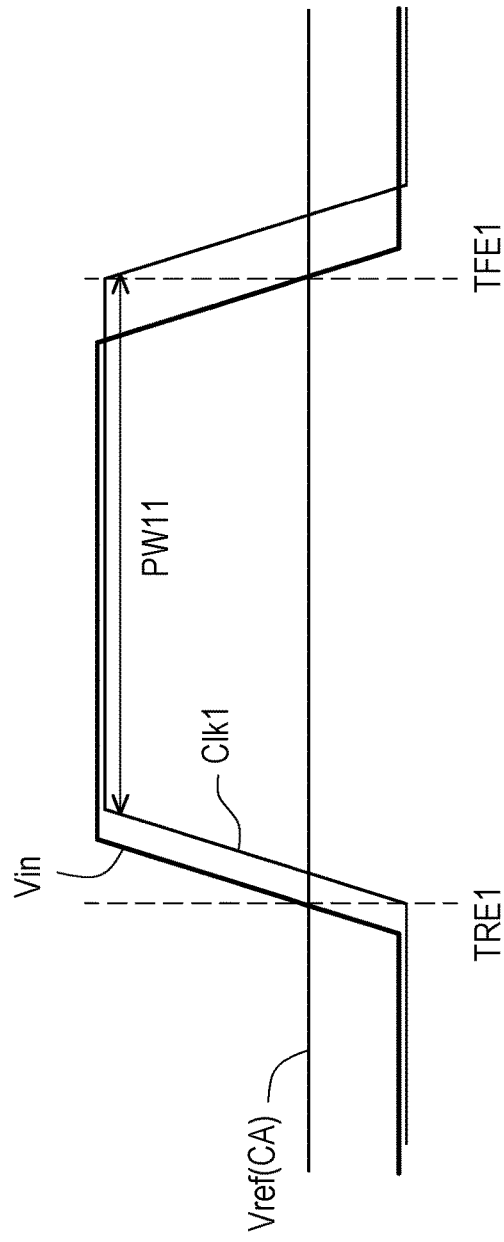
FIGS. 2B and 2C illustrate operating waveforms of the first comparator 201 in accordance with some embodiments of the present disclosure.
Figure 2C:
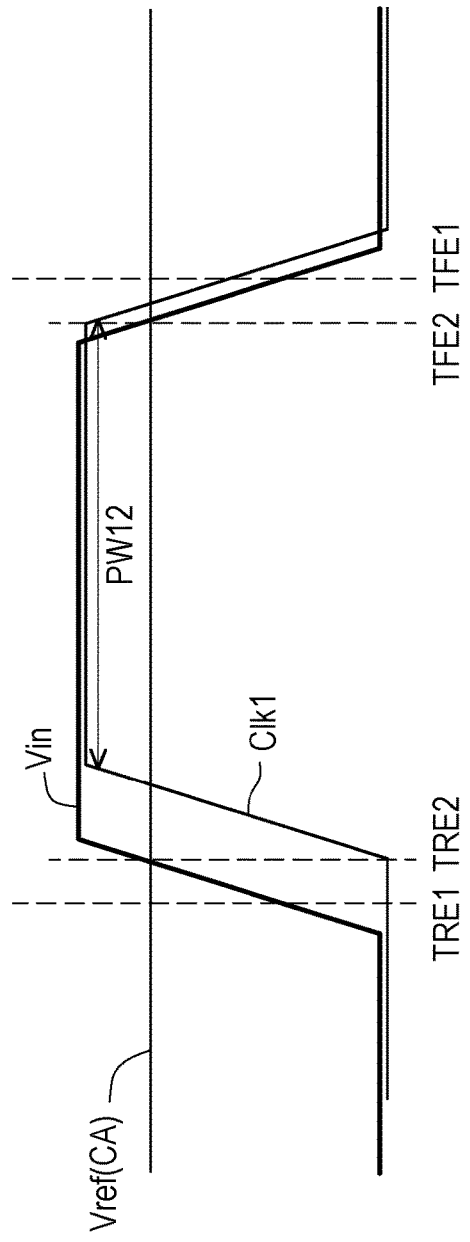

FIGS. 2B and 2C illustrate operating waveforms of the first comparator 201 in accordance with some embodiments of the present disclosure. Specifically, FIGS. 2B and 2C are used for describing how the first pulse width of the first clock signal Clk1 is adjusted by the reference voltage Vref(CA) controlled by the CA training signal TCA. Specifically, FIG. 2B illustrate the operating waveform when the first comparator 201 receives the reference voltage Vref(CA) at a relatively low voltage level. Please refer to FIGS. 2A and 2B together for better understanding descriptions of how the first pulse width of the first clock signal Clk1 is determined according to the reference voltage Vref(CA) in the following paragraphs.

Particularly, in FIG. 2B, the input signal Vin and the reference voltage Vref(CA) set at the relatively low voltage level are respectively provided to the first input end and the second input end of the first comparator 201. In this embodiment, the input signal Vin and the reference voltage Vref (CA) are respectively provided to a positive input end and a negative input end of the first comparator 201. The first comparator 201 compares the input signal Vin with the reference voltage Vref(CA) to pull up the first clock signal Clk1 when the first comparator 201 determines that the input signal Vin is greater than or equal to the reference voltage Vre(CA), and pull down the first clock signal Clk1 when the first comparator 201 determines that the input signal Vin is less than the reference voltage Vre(CA). In FIG. 2B, the input signal Vin is a square wave initially switched at low voltage, and the first comparator 201 outputs the first clock signal Clk1 at a low voltage according to the input signal Vin. As the input signal Vin is switched from low to high and gradually increased, the first comparator 201 starts to pull the first clock signal Clk1 up at a time point TRE1 when the input signal Vin is greater than or equal to the reference voltage Vref(CA). Similarly, as the input signal Vin is switched from high to low and gradually lowered, the first comparator 201 starts to pull the first clock signal Clk1 down at a time point TFE1 when the input signal Vin is less than the reference voltage Vref(CA). Therefore, the first pulse width PW11 of the first clock signal Clk1 negatively correlated to the reference voltage Vref(CA) may be generated by operations of the first comparator 201.

In FIG. 2C, similar operations are performed by the first comparator 201 to generate the first clock signal Clk1 with the first pulse width PW12. However, in FIG. 2C, the reference voltage Vref(CA) is set to a relatively high voltage level than that in FIG. 2B. As can be seen in FIG. 2C, the first clock signal Clk1 is pulled up at a time point TRE2 and pulled down at a time point TFE2. Determined by the relatively high Vref(CA), a rising edge of the first clock signal Clk1 in FIG. 2C is set later, and a falling edge of the first clock signal Clk1 in FIG. 2C is set earlier. Consequently, a first pulse width PW12 of the first clock signal Clk1 in FIG. 2C is shorter than the first pulse width PW11 of the first clock signal Clk1 in FIG. 2B. Therefore, it is demonstrated in FIGS. 2B and 2C that the pulse width of the first clock signal Clk1 is adjustable by the reference voltage Vref(CA) further controlled by the CA training signal TCA.

Get back to FIG. 2A, the first clock signal Clk1 is provided to the second training circuit 21. The second training circuit 21 evaluates whether to adjust the first pulse width of the received first clock signal Clk1 according to the CA training signal TCA. Specifically, when the CA training signal TCA is enabled, it represents that the first training circuit 20 is instructed by the processor to generate the first clock signal Clk1 with the desired first pulse width. In this way, there is no necessity for the second training circuit 21 to adjust the first pulse width of the first clock signal Clk1, so that the second training circuit 21 may pass the first clock signal Clk1 to the output as the second clock signal Clk2.

Further, when the CA training signal TCA is not enabled, it represents that the reference voltage Vref(CA) at the undefined or the default voltage level, further affecting the first pulse width of the first clock signal Clk1 to be set at an undefined or at an undesired time length. Thus, when it is determined that the CA training signal TCA is not enabled, the second training circuit 21 may be activated to adjust the first clock signal Clk1 having first pulse width to the second clock signal Clk2 having the second pulse width. The second training circuit 21 includes an adjusting circuit 210 and a pulse width detector 211. The adjusting circuit 210 is configured to adjust the first pulse width of the first clock signal Clk1 to generate the second clock signal Clk2. Further, the pulse width detector 211 is configured to sense the second pulse width of the second clock signal Clk2 to generate an adjusting signal Adj to the adjusting circuit 210. Further, the adjusting circuit 211 is configured to compare the second clock signal Clk2 with a reference clock signal Clkref to generate the adjusting signal Adj, such that the adjusting signal Adj may be provided to the adjusting circuit 210 to adjust the first clock signal Clk1. In some embodiments, a duty cycle of the reference clock signal Clkref is 50%, and the adjusting circuit 210 is configured to adjust the first pulse width of the first clock signal to approximate the duty cycle ratio of the reference clock signal Clkref. In this way, the second training circuit 211 may adjust the first pulse width of the first clock signal Clk1 to a predetermined pulse width used for better CA transmission quality even if the CA training function is not activated or enabled by the processor.

Figure 2D:
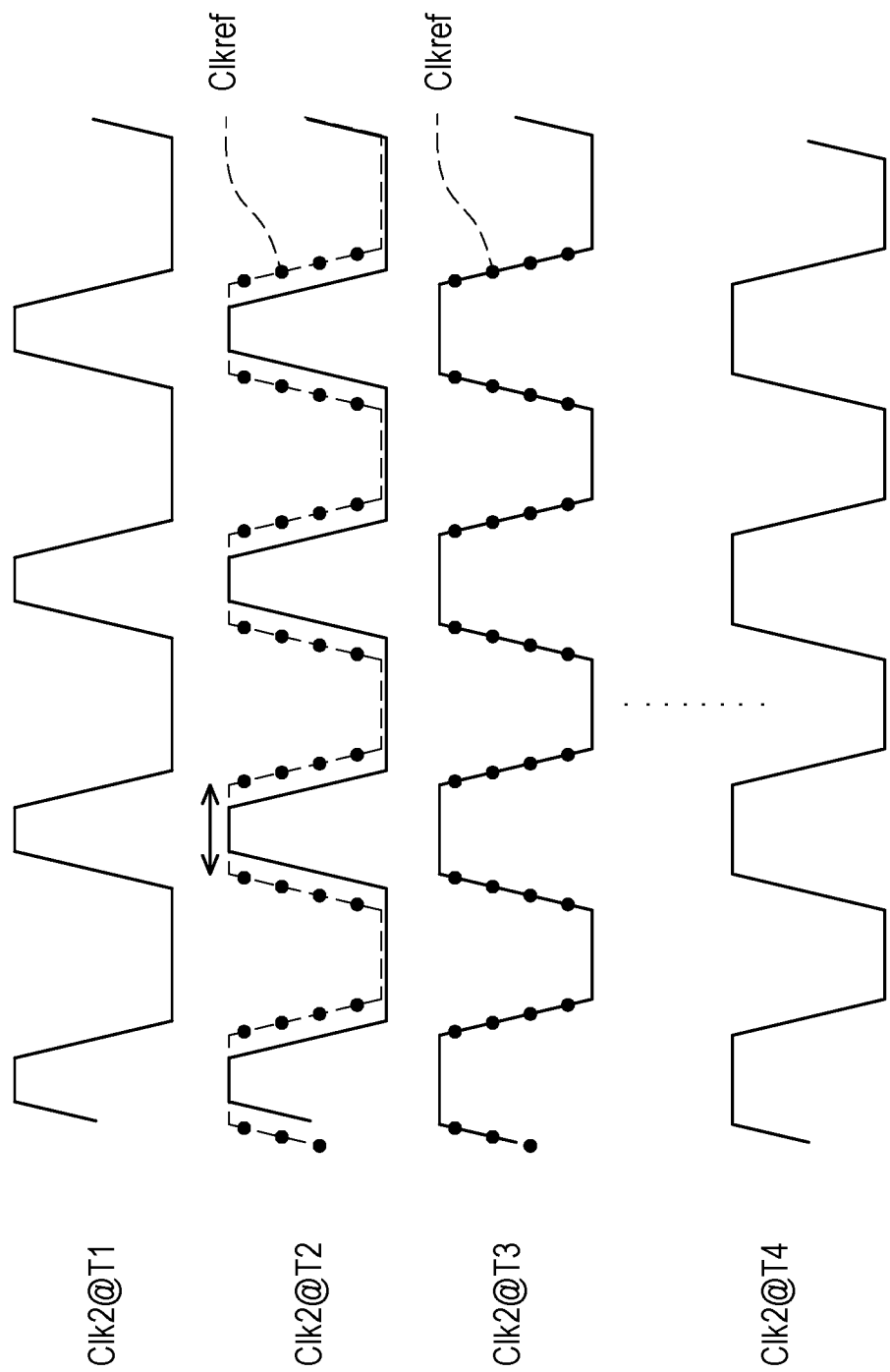
FIG. 2D illustrates operating waveforms of the second training circuit 211 at different time points in accordance with some embodiments of the present disclosure.

FIG. 2D illustrates operating waveforms of the second training circuit 211 at different time points in accordance with some embodiments of the present disclosure. Specifically, FIG. 2D in sequence illustrates waveforms of the second clock signal Clk2 at time points T1-T4. Initially, the second clock Clk2 with a relatively short positive half cycle is generated by the second training circuit 211. At the time point T2, the second comparator 211 compares the second clock signal Clk2 with the reference clock signal Clkref in dotted line, and instructs the adjusting circuit 210 that the second pulse width of the second clock signal Clk2 is shorter than a reference pulse width of the reference clock signal Clkref through the adjusting signal Adj. Thus, at the time point T3, the adjusting circuit 210 keeps adjusting the first pulse width of the first clock signa Clk1 until the output second pulse width of the second clock signal Clk2 reaches the reference pulse width of the reference clock signal Clkref.

Figure 3A:
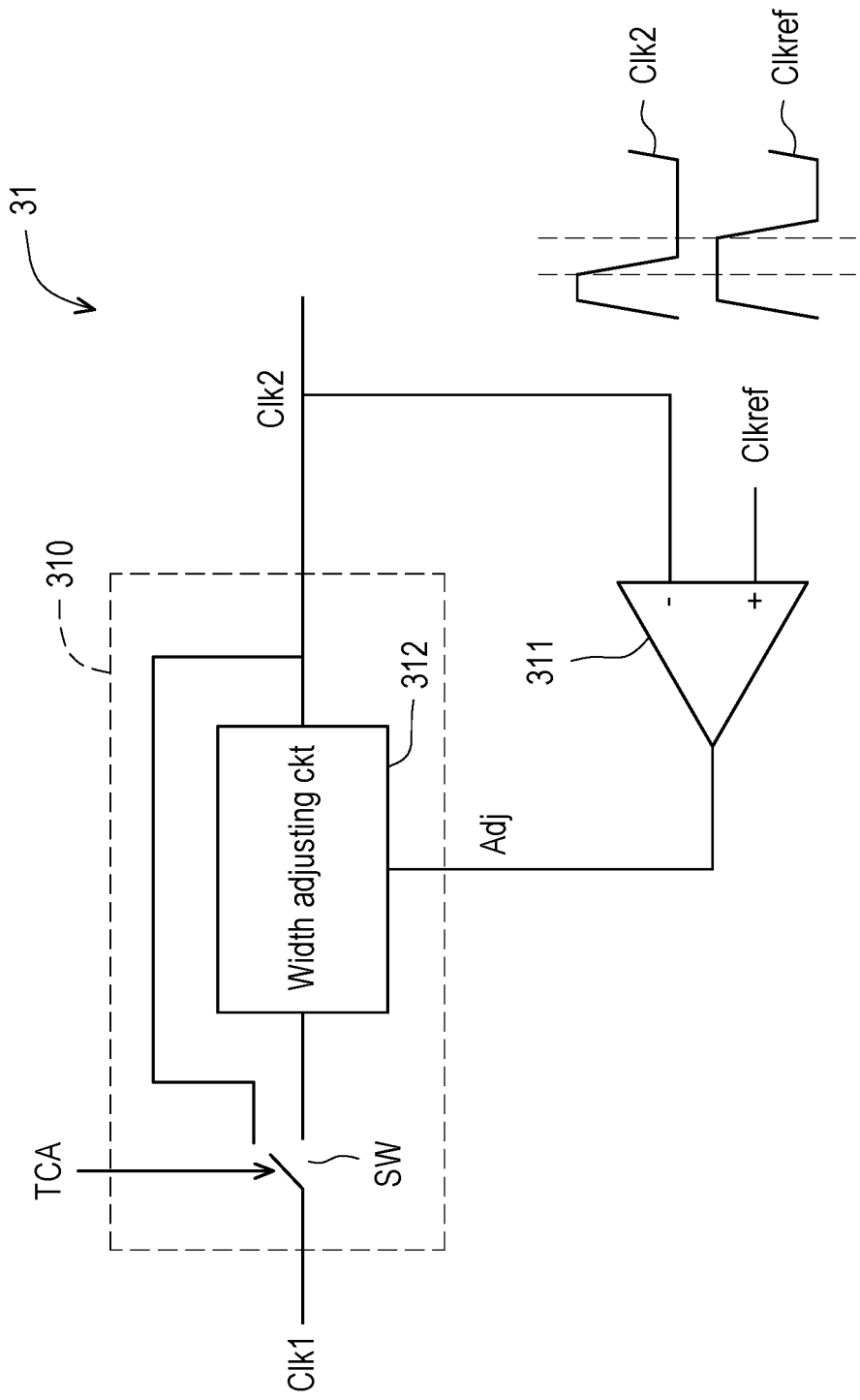
FIG. 3A illustrates a second training circuit 31 in accordance with some embodiments of the present disclosure.

FIG. 3A illustrates a second training circuit 31 in accordance with some embodiments of the present disclosure. Specifically, the second training circuit 31 in FIG. 3A is similar to the second training circuit 21 in FIG. 2A with more detailed circuit blocks are illustrated in the second training circuit 31. The second training circuit 31 includes an adjusting circuit 310 and a second comparator 311. The adjusting circuit 310 includes a switch SW and a width adjusting circuit 312. The switch SW is controlled by the CA training signal TCA to pass the first clock signal Clk1 and output as the second clock signal Clk2, or to adjust the first clock signal Clk1 having the first pulse width to the second clock signal Clk2 having the second pulse width. Further, the second clock signal Clk2 is provided to a negative input end of the second comparator 311, while the reference clock Clkref is provided to a positive input end of the second comparator 311. The second comparator 311 is configured to compare pulse widths of the second clock signal Clk2 with the reference clock signal Clkref, such that the adjusting circuit 310 may adjust the first pulse width of the first clock signal Clk1 according to the adjusting signal Adj from the second comparator 311.

In some embodiment, the adjusting signal Adj may be a comparison result either at a high or low voltages, so that the width adjusting circuit 312 may lengthen or shorten the first pulse width of the first clock signal Clk1 according to the adjusting signal Adj. In other embodiments, the width adjusting circuit 312 may be a phase lock loop (PLL) or a delay lock loop (DLL) based circuit that is capable of outputting the second clock signal Clk2 with different pulse widths according to an analog or a digital control signal.

Figure 3B:
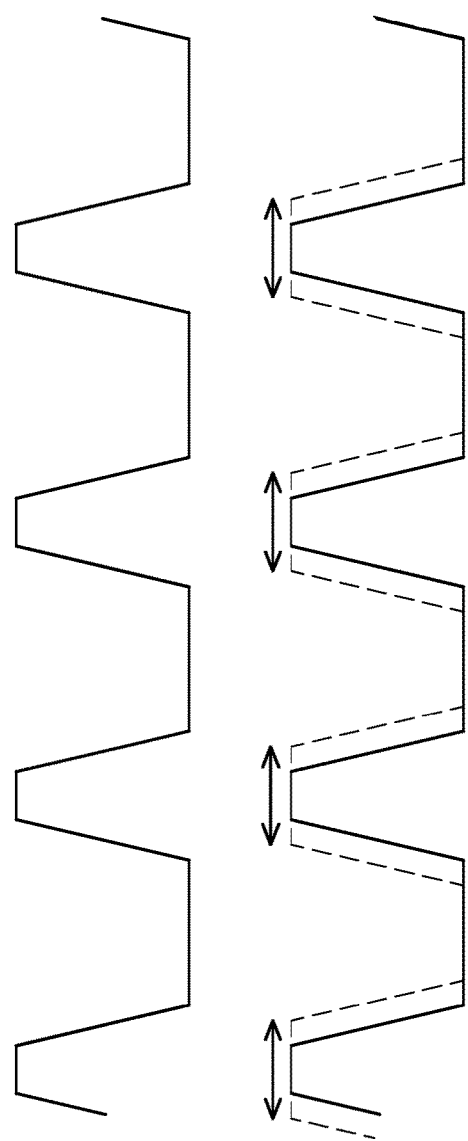
FIGS. 3B and 3C illustrate different operating waveforms of the second training circuit 31 in accordance with some embodiments of the present disclosure.
Figure 3C:
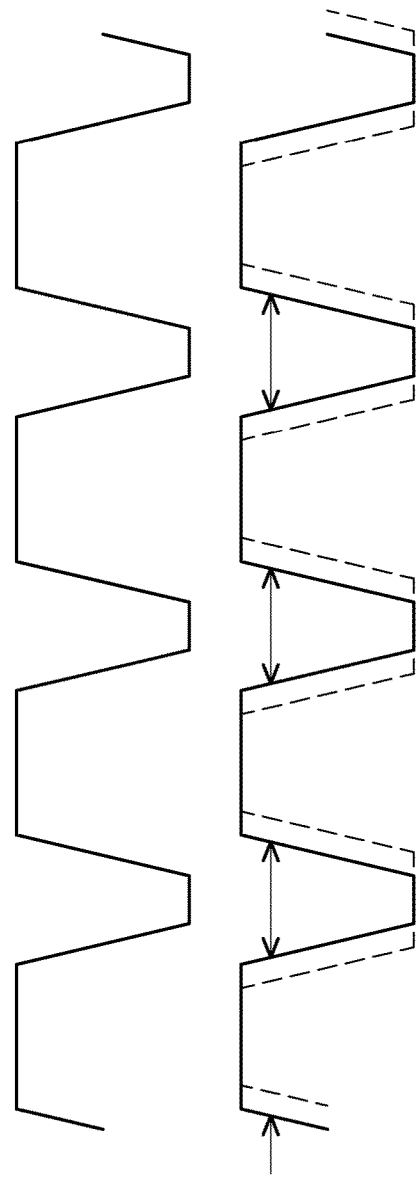

FIGS. 3B and 3C illustrate different operating waveforms of the second training circuit 31 in accordance with some embodiments of the present disclosure. Specifically, as shown in FIG. 3B, the second training circuit 31 initially outputs the clock signal Clk2 with relatively short positive half cycle at a time point T31. Then, at a subsequent time point T32, the second training circuit 31 may be functioning to output the second clock signal Clk2 with the lengthened second pulse width. The adjusting operation may be performed by the second training circuit 31 until the second pulse width of the second clock signal Clk2 approximates or is the same as the reference pulse width of the reference clock signal Clkref, which may have a duty cycle ratio of 50%. Further, as shown in FIG. 3C, the second training circuit 31 initially outputs the clock signal Clk2 with relatively long positive half cycle at a time point T33. Then, at a subsequent time point T34, the second training circuit 31 may be functioning to output the second clock signal Clk2 with the shortened second pulse width. The adjusting operation may be performed by the second training circuit 31 until the second pulse width of the second clock signal Clk2 approximates or is the same as the reference pulse width of the reference clock signal Clkref.

In summary, the memory device of the present disclosure may receive the instruction from the processor to perform the CA training function for adjusting the reference voltage Vref(CA). However, when the memory device determines that the CA training function is enabled by the processor through evaluating to the CA training signal, the memory device may also perform the training function by itself to adjust pulse width of the clock signal used for CA accessing. Therefore, the memory device may effectively maintain the transmission quality even if the CA training function is not activated or enabled by the processor.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
    a first training circuit, configured to generate a first clock signal having a first pulse width according a command address (CA) training signal;
    a second training circuit, coupled to the first training circuit and configured to adjust the first pulse width of the first clock signal to output a second clock signal having a second pulse width when it is determined that the CA training signal is not enabled.

2. The memory device of claim 1, wherein when it is determined that the CA training signal is enabled, the second training circuit is configured to pass the first clock signal as the second clock signal.

3. The memory device of claim 1, wherein the first training circuit comprises:
    a reference voltage training circuit, configured to output a reference voltage according to the CA training signal; and
    a first comparator, configured to receive an input signal and the reference voltage respectively at a first and second input ends of the first comparator, and output the first clock signal at an output end of the first comparator.

4. The memory device of claim 3, wherein the reference voltage training circuit is configured to adjust the reference voltage according to the CA training signal.

5. The memory device of claim 3, wherein the input signal is provided to a positive input end of the first comparator, the reference voltage is provided to a negative input end of the first comparator, and the first comparator is configured to generate the first clock signal having the first pulse width negatively correlated to the reference voltage.

6. The memory device of claim 3, wherein the reference voltage training circuit comprises:
    a first resistor and a second resistor coupled in series between a first supply voltage and a second supply voltage, and the reference voltage is generated at a node coupled between the first resistor and the second resistor,
    wherein at least one of the first resistor and the second resistor is a variable resistor controlled by the CA training signal.

7. The memory device of claim 1, wherein the second training circuit comprises:
    an adjusting circuit, configured to:
        adjust the first pulse width of the first clock signal to generate the second clock signal when it is determined that the CA training signal is not enabled; and
        pass the first clock signal as the second clock signal when it is determined that the CA training signal is enabled; and
    a pulse width detector, configured to sense the second pulse width of the second clock signal to generate an adjusting signal to the adjusting circuit,
    wherein the adjusting circuit adjusts the first pulse width of the first clock signal according to the adjusting signal.

8. The memory device of claim 7, wherein the pulse width detector comprises:
    a second comparator, configured to compare the second clock signal with a reference clock signal to generate the adjusting signal.

9. The memory device of claim 8, wherein the second comparator is configured to receive the second clock signal and the reference clock respectively at a first input end and a second input end of the second comparator, and generate the adjusting signal at an output end of the second comparator.

10. The memory device of claim 9, wherein the second clock signal is provided to a negative input end of the second comparator, the reference clock signal is provided to a positive input end of the second comparator, and the first pulse width is negatively correlated to the reference voltage.

11. The memory device of claim 8, wherein the reference clock signal has a duty cycle ratio of 50%, and the second comparator is configured to adjust the first pulse width of the first clock signal to approximate the duty cycle ratio of the reference clock signal.

\* \* \* \* \*